United States Patent [19]

Gisdakis et al.

[11] Patent Number: 5,057,668

[45] Date of Patent: Oct. 15, 1991

[54] DEVICE FOR THE IMPLEMENTATION OF A CURING PROCESS AT A SEMICONDUCTOR WAFER AND METHOD FOR CURING A SEMICONDUCTOR WAFER

[75] Inventors: Spyridon Gisdakis, Munich; Joachim Hoepfner, Planegg, both of Fed. Rep. of Germany

[73] Assignee: Siemens Aktiengesellschaft, Munich, Fed. Rep. of Germany

[21] Appl. No.: 232,237

[22] Filed: Aug. 15, 1988

[30] Foreign Application Priority Data

Sep. 16, 1987 [DE] Fed. Rep. of Germany ....... 3731148

[51] Int. Cl.[5] .......................... F27B 5/14; H05B 3/62
[52] U.S. Cl. .................................... 219/390; 219/411
[58] Field of Search ........................ 219/390, 405, 411; 392/424; 118/725, 728, 50.1

[56] References Cited

U.S. PATENT DOCUMENTS

| | | | |
|---|---|---|---|
| 3,311,694 | 3/1967 | Lasch | 219/390 |
| 4,331,485 | 5/1982 | Gat | 148/1.5 |
| 4,356,384 | 10/1982 | Gat | 392/424 |
| 4,481,406 | 11/1984 | Muka | 219/411 |
| 4,535,228 | 8/1985 | Mimura | 219/411 |
| 4,545,327 | 10/1985 | Campbell | 219/411 |
| 4,581,520 | 4/1986 | Vu | 219/411 |
| 4,694,143 | 9/1987 | Nishimura | 219/405 |
| 4,760,244 | 7/1988 | Hokynar | 219/390 |

FOREIGN PATENT DOCUMENTS 2160355 12/1985 United Kingdom .

OTHER PUBLICATIONS

Grange et al., Capless Annealing of Silicon Implanted Gallium Arsenide, Solid State Electronics, vol. 26, No. 4, 1983, pp. 313–317.
T. O. Sedgwick, Short Time Annealing, ECS-Fall Meeting, Oct. 1982.
H. Kanber et al., Rapid Thermal Annealing of Si Implanted GaAs for Power Field-Effect Transistors, Applied Physics Letter, 47 (2), Jul. 1985, pp. 120–122.
Kuzuhara et al., Rapid Thermal Annealing of III-V Compound Materials, Mat. Res. Soc. Synp. Proc., vol. 23 (1984), pp. 651–652.

Primary Examiner—Teresa J. Walberg
Attorney, Agent, or Firm—Hill, Van Santen, Steadman & Simpson

[57] ABSTRACT

In an apparatus for curing semiconductor wafers implementing same is provided. Pursuant to the method, semiconductor wafers, for example, GaAs, are cured in a reaction tube under a protective gas atmosphere of, for example, a mixture of $N_2$ and $AsH_3$. The reaction tube is initially heated to a base temperature at which the curing process is not initiated and at which no wall coatings occur. Given semiconductor wafers of compound semiconductors such as, for axample, GaAs, the protective atmosphere contains a compound of the more volatile element, for example, $AsH_3$, that decomposes at the base temperature and forms an over-pressure of the more volatile element. The semiconductor wafer is heated to the curing temperature with a selective heater, for example a lamp, and is exposed to the curing temperature for 5 through 20 seconds.

20 Claims, 1 Drawing Sheet

DEVICE FOR THE IMPLEMENTATION OF A CURING PROCESS AT A SEMICONDUCTOR WAFER AND METHOD FOR CURING A SEMICONDUCTOR WAFER

BACKGROUND OF THE INVENTION

The present invention is directed to a device for the implementation of a curing process at a semiconductor wafer.

In order to cure crystal defects that can arise, for example, during implantation, it is known to subject semiconductor wafers to a heat treatment process. In curing the implanted layers, the doping profiles that have been set must be largely preserved and the layer structures should not bleed. Further, the formation of the eliminations is suppressed in the case of higher dopings.

Methods that meet these requirements are known (see, for example, D. O. Sedgwick, Short Time Annealing, ECS-Fall Meeting, October 1982). Rapid thermal processing (RTP) is a method wherein only the semiconductor wafer to be cured and, potentially, a reference wafer are heated to a high temperature. The heating proceeds extremely quickly with temperature gradients of, for example, $10^{3\circ}$ C./sec. The semiconductor wafers are exposed to a high temperature for a brief period of time and are subsequently cooled. For example, the wafers may be exposed to a temperature of 900° C. for 5 to 20 seconds.

The semiconductor wafer can be heated by, for example, the light energy of a strong light source such as, for example, a laser or a lamp. The semiconductor wafer can also be heated by an electrical resistance heating element having a low heat capacity. During the process, the semiconductor wafer is located in a reaction chamber. For example, the semiconductor can be located in a reaction chamber constructed from silica glass. The curing process occurs in an inert atmosphere or in a vacuum. In this process, the diffusion-caused redistribution of imperfections is suppressed as a result of the short annealing time. It is thus assured that the aforementioned requirements are met.

In the RTP method there is a large temperature gradient during the curing process between the semiconductor wafer, that is heated to a curing temperature and the chamber wall that is at ambient temperature. Therefore, when semiconductor material evaporates from the semiconductor wafer, it precipitates onto the chamber wall. When the semiconductor wafer is heated by light energy, the precipitation causes temperature inhomogeneities because the light is partially absorbed by the precipitate. This results in the acquisition and control of the temperature by pyrometers to be faulty. Furthermore, because of the temperature inhomogeneities, the heating process is retarded.

A further problem in curing semiconductor wafers occurs due to the construction of the semiconductors. Semiconductors constructed from two or more elements (i.e., a compound), especially III–V compounds, present problems in curing. Since the elements of the compound have different vapor pressures, the more volatile element escapes first. This leads to an undesirable surface erosion of the semiconductor wafers.

This disadvantage can be alleviated when the semiconductor wafer to be cured is embedded, for example, between two semiconductor wafers or silica plates that are also heated to the curing temperature (see, for example, H. Kanber et al, Appl. Phys. Lett. 47 (2), July 1985, pages 120 ff.). This process reduces the surface erosion. However, this procedure increases the heat capacity of the system and thus the heat flow into the semiconductor wafer becomes more difficult.

Surface erosion can also be avoided by protecting the semiconductor wafer with a cover layer of, for example, $Si_3N_4$, during curing (see, for example, H. Kanber et al, Appl. Phys. Lett. 47 (2), July 1985, pages 120 ff.; M. Kuzuhara et al, Mat. Res. Soc. Symp. Proc. Vol. 23 (1984), pages 651 ff.). This procedure, however, has the disadvantage that mechanical tensions and the redistribution of imperfections occur in the semiconductor wafer.

Surface erosion can also be avoided, without the use of a cover layer, in what is referred to as the capless annealing method (see, for example, J. D. Grange et al, Solid State Electronics, Vol. 26, No. 4, 1983, pages 313 ff.). Pursuant to this method, the curing process occurs in an atmosphere that contains an over-pressure of the more volatile element. The over-pressure prevents an evaportion of the more volatile component of the semiconductor. The over-pressure arises by splitting a gaseous hydrogen compound of the more volatile element that is contained in the protective atmosphere. The splitting of the gaseous hydrogen compound is carried out at the curing temperature. This method has the disadvantage that there is a diffusion of imperfections and, thus, a partial destruction of the doping profiles that arises during the heating times required by the method (the curing time: is approximately 10–60 minutes; and the heating time: is approximately 15 minutes).

A combination of the RTP method with the capless annealing method, wherein the reaction chamber in the RTP method is filled with the afore-mentioned hydrogen compound, is not presently viable. This is due to the fact that the heating and curing time in the RTP method ar too short to split the hydrogen compound and thus create an over-pressure of the more volatile component.

There is therefore a need for an improved method and device for curing semiconductor wafers.

SUMMARY OF THE INVENTION

The present invention provides an improved curing method for semiconductor wafers and a device in which the curing method can be carried out.

To this end, the present invention provides a device for the implementation of a curing process at a semiconductor wafer. The process includes a reaction tube for receiving the semiconductor wafer. The reaction tube includes at least one gas admission port and at least one gas discharge port. A heater is provided for heating the reaction tube to a base temperature. The device also includes a selective heater for heating the semiconductor wafer to a curing temperature.

In an embodiment, the device includes an auxiliary tube which is connected to the reaction tube. At least one gas admission port is provided at the point of attachment between the auxiliary tube and the reaction tube. The point of attachment between the auxiliary tube and the reaction tube is so constructed and arranged that a counter-current flow of inert gas can be generated through the gas admission port. The gas flow causes decomposition products arising in the reaction tube to flow into the auxiliary tube.

In a further embodiment of the device, the auxiliary tube is plugged into the reaction tube. To this end, the auxiliary tube and the reaction tube each include a flange part located on the side at which they contact one another. A sealing ring is provided that is pinched between the two flange parts when the auxiliary tube and the reaction tube are plugged together.

In an embodiment, a resistance heater is integrated in the outside wall of the reaction tube as a basic heater for heating the reaction tube to a base temperature.

In an embodiment, the basic heater includes a black body. The black body is integrated into the reaction tube and at least one lamp is provided for irradiating the black member. The black member is constructed so that it absorbs the light energy and converts it into heat.

In an embodiment, the reaction tube includes two walls that define an interspace and the basic heater is composed of a theromastatized fluid that is located in the interspace.

In another embodiment, the basic heater is an electrical resistance heater worked into the interspace between the two walls of the reaction tube. The electrical resistance heater is so constructed and arranged that it allows the area above and below the semiconductor wafer to not be cured. The inside wall of the reaction tube is uniformly maintained at the base temperature through the assistance of a circulating gas stream.

In an embodiment. The device includes lamps that function as selective heaters for curing the semiconductor wafer.

A method for curing a semiconductor wafer is also provided by the present invention. The method includes the steps of: placing the semiconductor wafer in a reaction tube; connecting the reaction tube to a controllable gas supply system: sealing the reaction tube and filling it with an inert gas; heating the walls of the reaction tube to a base temperature that is sufficiently high that no evaporated material precipitates onto the walls of the reaction tube and is sufficiently low that the curing process does not begin; selectively heating, for a few seconds, the semiconductor wafer to its curing temperature with a selective heater; cooling the apparatus to room temperature: and then removing the semiconductor wafer.

In an embodiment of the method, the semiconductor wafer is composed of a compound, particularly of a III-V compound and the inert gas contains a gaseous compound of the more volatile component of the compound, particularly the hydrogen compound of the more volatile component. The base temperature is chosen so that it is sufficiently high that the gaseous compound of the more volatile component is decomposed into its constituents and generates an over-pressure of the more volatile component.

In an embodiment of the method, after the semiconductor wafer is inserted into the reaction tube, the reaction tube is joined to an auxiliary tube in a vacuum-tight fashion. A decomposition product of said inert gas is then fed into the auxiliary tube by a counter-current flow of a further inert gas. The decomposition products are allowed to precipitate in the auxiliary tube, and after the apparatus is cooled to room temperature, the auxiliary tube is removed for cleaning.

Pursuant to the present invention, the advantages of the RTP method are coupled to the advantages of the capless annealing method in that the reaction chamber is heated to a base temperature. The base temperature is selected such that precipitates on the chamber wall are prevented and that, when using a hydrogen compound as the inert gas, the hydrogen compound is split and an over-pressure of the more volatile component thereby arises. Since the semiconductor wafer is selectively heated to the curing temperature, the system to be heated is limited and only brief heating times are required.

Because the present invention controls the gas supplied to the system, the required pressure of the inert gas can be designationally set In particular, the over-pressure of the more volatile component can be precisely adapted to the semiconductor wafer.

An advantage of the device of the present invention is that decomposition products arise and precipitate into the auxiliary tube and the auxiliary tube can be detached and easily cleaned. Furthermore, installation and detachment of the auxiliary tube is simple.

An advantage of the method of the present invention is that due to the over-pressure of the more volatile component a surface erosion during the curing process is prevented.

Additional features and advantages of the present invention will be described in, and apparent from, the detailed description of the presently preferred embodiments and from the drawings.

DETAILED DESCRIPTION OF THE PRESENTLY PREFERRED EMBODIMENTS

Figure 1:
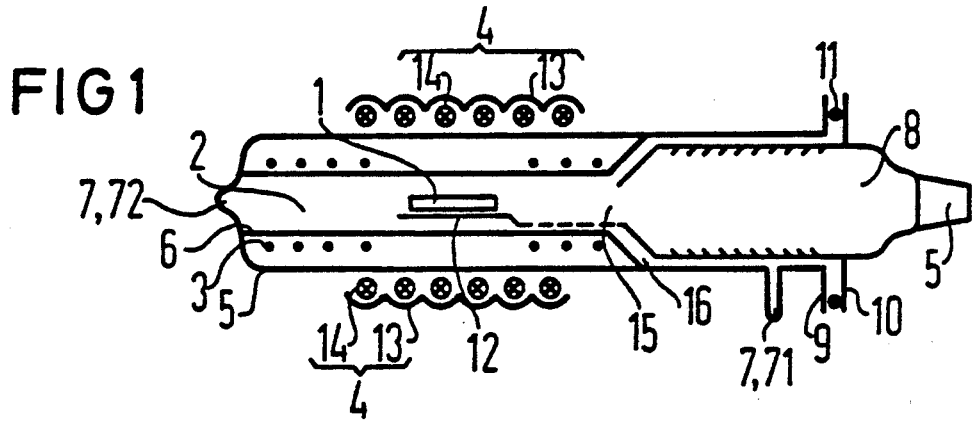
FIG. 1 illustrates a perspective view of a device for curing semiconductor wafers of the present invention.

The present invention provides an improved device and method for curing semiconductor wafers. Referring to FIG. 1, a reaction tube 2 is provided in which a semiconductor wafer 1, to be cured, is positioned on a receptacle 12. Preferably, the reaction tube 2 is constructed from silica glass. As illustrated, the reaction tube 2 includes an inside wall 6 and an outside wall 5. The double walls of the reaction tube precede, surround, and follow the portion of the tube occupied by the semiconductor wafer 1.

The double walls, i.e., inside wall 6 and outside wall 5 define an interspace. A basic heater 3 is worked into the interspace located between the inside wall 6 and the outside wall 5. The basic heater 3 can be, for example, an electrical resistance heater.

The reaction tube 2 includes two gas admission ports 7. The two gas admission ports 7 are positioned so that when the semiconductor wafer 1 is located in the reaction tube 2, it lies between the two gas admission ports 7. The reaction tube 2 includes, on one side thereof, a flange 9.

A selective heater 4 is located at a position outside of the reaction tube 2 above the semiconductor wafer 1. The selective heater 4 includes lamps 14 and reflectors 13. The lamps 14 and the reflectors 13 are arranged so that light of the lamps is directed onto the semiconductor wafer 1.

As illustrated, an auxiliary tube 8 is provided. The auxiliary tube 8 includes two openings 15 lying at opposite sides. The auxiliary tube 8 includes an auxiliary tube flange 10. The auxiliary tube flange 10 is so constructed and arranged that the surface surrounded by the auxiliary tube flange 10 intersects the connecting line of the openings 15 and such that the surface normal to the surface surrounded by the auxiliary tube flange 10 extends parallel to the connecting line of the openings 15.

The auxiliary tube is so constructed and arranged that it can be plugged into the reaction tube 2 by being received within the reaction tube 2 on the side of the reaction tube having the flange 9. A sealing face of the reaction tube flange 9 is thereby contacted by a sealing face of the auxiliary tube flange 10. A sealing ring 11 is provided that is located between the reaction tube flange 9 and the auxiliary tube flange 10. The sealing ring 11 functions to seal the connection of the reaction tube flange 9 and the auxiliary tube flange 10.

The auxiliary tube 8 is constructed so that an interspace 16 arises between the reaction tube 2 and the auxiliary tube 8, when the auxiliary tube is plugged into the reaction tube, at the side facing toward the reaction tube 2. A first gas admission 71, facing toward the reaction tube flange 9 is attached at the interspace 16. Inert gas is admitted through the first gas admission 71, facing toward the reaction tube flange 9, and is fed through the interspace 16 to the opening 15 of the auxiliary tube 8 that faces toward the reaction tube 2. Gas is then fed to a disposal system via the opening 15 that faces away from the reaction tube 2.

Figure 2:
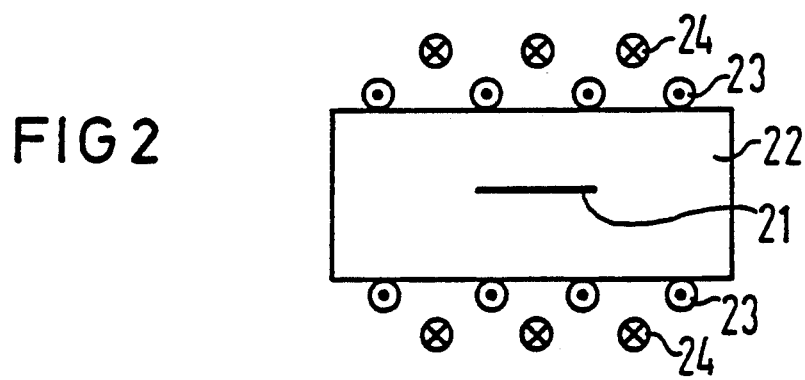
FIG. 2 illustrates a perspective view of an embodiment of the device of the present invention wherein the base temperature is produced by a resistance heater.
Figure 3:
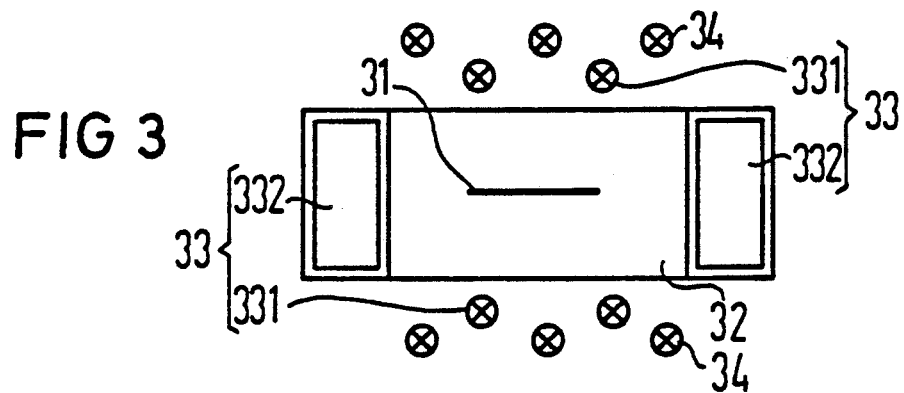
FIG. 3 illustrates a perspective view of another embodiment of the device of the present invention wherein graphite blocks irradiated and heated by lamps provide the heat for the base temperature.
Figure 4:
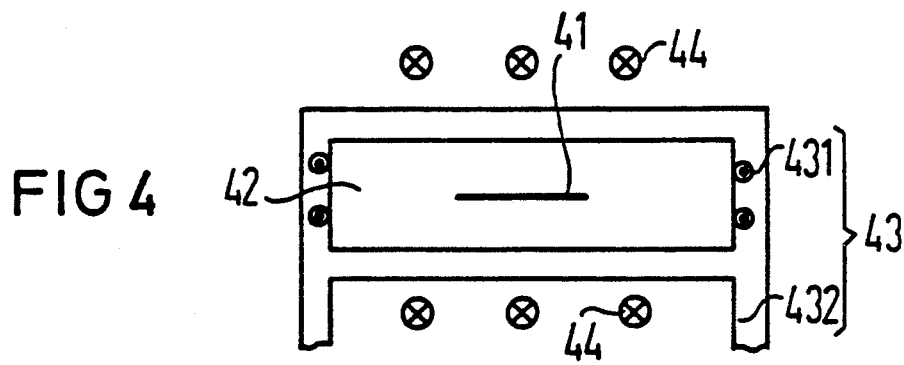
FIG. 4 illustrates a perspective view of another embodiment of the device of the present invention wherein the base temperature is set by a resistance heater and a uniform temperature distribution at the inside chamber wall is maintained by the use of a gas stream.

FIGS. 2 through 4 illustrate various embodiments of the basic heater 3 of the present invention.

FIG. 2 illustrates a cross-sectional view through a second reaction tube 22, constructed from silica glass, perpendicular to the plane of the device illustrated in FIG. 1 and perpendicular to a second semiconductor wafer 21 to be cured. The second reaction tube 22 has a single-walled construction. A second basic heater 23 is located outside of the second reaction tube 22 above and below the second semiconductor wafer 21. The second basic heater 23 is composed of an electrical resistance heater.

A second selective heater 24 is provided, and is located above the second basic heater 23. The second selective heater 24, similar to the selective heater 4 in the first embodiment, includes a lamp arrangement. The arrangement of the second basic heater 23 and of the second selective heater 24 is such that the electrical resistance heater is positioned offset from the lamps. Temperature inhomogeneities that are produced by shadows on the second semiconductor wafer are thereby reduced. The device is otherwise of a construction that is substantially similar to the device set forth in the first embodiment.

A further embodiment of the present invention is illustrated in FIG. 3. The device includes a third reaction tube 32 of silica glass. Located in the third reaction tube 32 is a third semiconductor wafer 31 to be cured. The view illustrated in FIG. 3 is substantially similar to that illustrated in FIG. 2. Graphite blocks 332 are encapsulated in the walls of the third reaction tube 32 on each of its two sides at the side of the third semiconductor wafer 31. The walls of the reaction tube 32 above and below the third semiconductor wafer 31 are single walls.

Base temperature lamps 331 are arranged in a first row above and below the third semiconductor wafer 31. The base temperature lamps 331 and the graphite blocks 332 form, with each other, a third basic heater 33. To this end, the graphite blocks 332 are irradiated by the base temperature lamps 331. The graphite blocks 332 act as black radiators and convert the light energy into heat.

The device includes a third selective heater 34 located in a second row following the lamps 331. The third selective heater 34 includes lamps that are oriented such that the base temperature lamps 331 are not disrupted when heating the third semiconductor wafer 31 to curing temperature. Otherwise, the device set forth in FIG. 3 is constructed similar to the device set forth in the first embodiment illustrated in FIG. 1.

FIG. 4 illustrates a further embodiment of the present invention. As illustrated, a fourth reaction tube 42 is provided that is constructed from silica glass. Located in the fourth reaction tube 42 is a fourth semiconductor wafer 41 to be cured. A fourth basic heater 43 is also provided. The view illustrated in FIG. 4 is similar to the view illustrated in FIG. 2. The fourth reaction tube 42 has a double-walled construction. The wall of the fourth reaction tube 42 is provided with two heat admissions 432.

An electrical resistance heater 431 is worked into the wall of the reaction tube 42 at the side of the fourth semiconductor wafer 41. A fourth selective heater 44 is attached at a position outside the fourth reaction tube 42 above and below the fourth semiconductor wafer 41. The fourth selective heater 44 includes a lamp arrangement.

In order to obtain a uniform temperature distribution in the fourth reaction tube 42, a heating agent, for example an inert gas flow that is introduced via the heat admissions 432, circulates in the wall of the fourth reaction tube 42. A thermostatized fluid, for example, can be used as the heating agent that sets the base temperature of the fourth reaction tube 42 without the electrical resistance heater 431.

The device illustrated in FIG. 4, except as set forth above, is otherwise similar to that set forth in the first embodiment. The advantage of this embodiment is that no shadows are cast onto the fourth semiconductor wafer 41 when the fourth selective heater 44 is turned on.

An embodiment of the method of the present invention for curing semiconductor wafers shall now be set forth with reference to FIG. 1. It should be noted, however, that the method can be used with other devices in an entirely analogous fashion, such as those of the embodiments illustrated in FIGS. 2-4.

Pursuant to the method, the second admission port 72 of the reaction tube 2, facing away from the reaction tube flange 9, is connected to a controllable gas supply system. The reaction tube 2 is connected to a further gas supply system via the first gas admission port 71 that faces toward the reaction tube flange 9. A semiconductor wafer 1 is placed onto the receptacle 12. The semiconductor wafer 1 can be, for example, composed of a III-V compound, particularly of GaAs.

A sealing ring 11 is positioned onto the sealing face of the reaction tube flange 9. The auxiliary tube 8 is inserted into the reaction tube 2 so that the sealing face of the auxiliary tube flange 10 faces the sealing face of the reaction tube flange 9. The connection between the reaction tube 2 and the auxiliary tube 8 is sealed by pressing the sealing ring 11 between the sealing faces of the flanges 9 and 10 of the reaction tube 2 and auxiliary tube 8, respectively. The auxiliary tube 8 is connected to a gas disposal system via an opening 15 that faces away from the reaction tube 2.

An inert gas is introduced into the reaction tube 2 via the second gas admission port 72. The inert gas provides a protective gas atmosphere. The inert gas, for example, can be $N_2$. If the semiconductor is constructed from a compound, i.e., more than one element, the protective atmosphere, in an embodiment, will contain a compound of the more volatile component, particularly the hydrogen compound of the more volatile component. In the case of a III-V semiconductor, for example GaAs, a gaseous V-compound, particularly a V-hydride, for example $AsH_3$, is used.

The base temperature in the reaction tube 2 is set by use of the basic heater 3. The base temperature is selected so that it is sufficiently low that the curing process of the semiconductor wafer 1 is not initiated. The base temperature is further selected so that it is sufficiently high that wall coatings due to precipitated material do not arise.

In the case of a semiconductor constructed from a compound, in an embodiment of the method, the base temperature is selected such that the protective atmosphere decomposes. When, for example, $AsH_3$ is used, a base temperature of about 300° C. (or more) is sufficient to decompose the hydride. An over-pressure of the more volatile component, for example $As_2$ and $As_4$, thereby arises. The over-pressure of the more volatile component is set via the controllable pressure of the protective atmosphere and, potentially, via the mixing ratio, so that an evaporation of the more volatile component during the curing process is prevented.

A further inert gas, for example $N_2$, is then introduced via the first gas admission 71. The further inert gas is introduced at such a pressure that a gas flow arises that causes the decomposition products of the protective atmosphere to be fed into the auxiliary tube 8. The decomposition products thereby precipitate in the auxiliary tube 8.

The selective heater 4, with which the semiconductor wafer 1 is heated to curing temperature, is then turned on. The selective heater 4 can be, for example, intense white lamps, particularly halogen lamps. The selective heater 4 functions to very rapidly heat the semiconductor wafer 1 to a curing temperature of, for example 900° C., for example at $10^{3°}$ C./sec. The semiconductor wafer 1 is exposed to the curing temperature for approximately 5 to about 20 seconds. The selective heater 4 is then turned off.

When the semiconductor wafer 1 reaches the base temperature again, the basic heater S is shut off. After the device has again reached room temperature, the protective atmosphere, and inert gas, are shut off. The reaction tube 2 and the auxiliary tube 8 are then rinsed with a non-toxic inert gas such as, for example, $N_2$; especially when the protective atmosphere contains toxic components such, as, for example, $AsH_3$.

The auxiliary tube 8 is then detached and cleaned of the decomposition products. The semiconductor wafer 1 is hen removed from the reaction tube 2.

If desired, a plurality of semiconductor wafers 1 can be simultaneously cured through the method of the present invention. To this end, a plurality of semiconductor wafers 1 are charged into the receptacle 12 at the same time.

It should be understood that various changes and modifications to the presently preferred embodiments described herein will be apparent to those skilled in the art. Such changes and modifications can be made without departing from the spirit and scope of the present invention and without diminishing its attendant advantages. It is therefore intended that such changes and modifications be covered by the appended claims.

We claim:

1. A device for curing a semiconductor wafer comprising:
    a reaction tube for receiving a semiconductor wafer, the reaction tube including at least one gas admission port and at least one gas discharge port;
    a heater for heating the reaction tube to a base temperature;
    a selective heater for heating the semiconductor wafer to a curing temperature;
    an auxiliary tube coupled to the reaction tube;
    at least one gas admission port provided at a point of attachment between the auxiliary tube and the reaction tube; and
    the point of attachment between the auxiliary tube and the reaction tube being so constructed and arranged that counter-current flow of inert gas is generated through the gas admission port, said flow conducting decomposition products arising in the reaction tube into the auxiliary tube.

2. The device of claim 1 wherein the auxiliary tube is plugged into the reaction tube, the auxiliary tube and the reaction tube each include a flange part having facing surfaces and a sealing ring is pinched between the facing surfaces of the two flange parts when the auxiliary tube and the reaction tube are plugged together, the sealing ring sealing the connection between the flanges.

3. The device of claim 1 wherein the reaction tube is constructed from silica glass.

4. The device of claim 1 wherein the heater is a resistance heater integrated into an inside wall of the reaction tube.

5. The device of claim 1 wherein the heater is a resistance heater integrated into an outside wall of the reaction tube.

6. The device of claim 1 wherein the heater includes a black body for absorbing light and converting it into heat, the black body, being integrated into the reaction tube, and lamps are provided for irradiation of the black body.

7. The device of claim 1 wherein the reaction tube includes two walls, an inner wall and an outer wall, in a region preceding, surrounding, and following the semiconductor wafer when it is positioned in the reaction tube to be cured.

8. The device of claim 7 wherein the heater includes an electrical resistance heater worked into an interspace defined by the inner and outer walls, the electrical resistance heater being so constructed and arranged that the area above and below the semiconductor wafer is not cured and the inside wall of the reaction tube is uniformly maintained at the base temperature with the assistance of a circulating gas stream.

9. The device of claim 1 wherein the selective heater includes at least one lamp for curing the semiconductor wafer.

10. A device for curing a semiconductor wafer comprising:

a reaction tube for receiving a semiconductor wafer, the reaction tube including at least one gas admission port and at least one discharge port, said reaction tube including two walls, an inner wall and an outer wall, in a region preceding, surrounding, and following the semiconductor wafer when it is positioned in the reaction tube to be cured;

a heater for heating the reaction tube to the base temperature; and a selective heater for heating the semiconductor wafer to a curing temperature.

11. The device of claim 10 wherein the heater includes a thermostatized that is located in an interspace defined by an inner and outer wall of the reaction tube.

12. The device of claim 10 wherein the heater includes an electrical resistance heater worked into an interspace defined by the inner and outer walls, the electrical resistance heater being so constructed and arranged that the area above and below the semiconductor wafer is not cured and the inside wall of the reaction tube is uniformly maintained at the base temperature with the assistance of a circulating gas stream.

13. The device of claim 10 wherein the selective heater includes at least one lamp for curing the semiconductor wafer.

14. A device for curing a semiconductor wafer comprising:

a reaction tube for receiving a semiconductor wafer, the reaction tube including at least one gas admission port and at least one gas discharge port;

a heater for heating a reaction tube to a base temperature, said heater includes at least one lamp for curing the semiconductor wafer; and a selective heater for heating the semiconductor wafer to a curing temperature.

15. A device for curing a semiconductor wafer comprising:

a reaction tube for receiving a semiconductor wafer, the reaction tube including at least one gas admission port and at least one gas discharge port;

a heater for heating the reaction tube to a base temperature; and a selective heater for heating the semiconductor wafer to a curing temperature.

16. The device of claim 15 wherein the reaction tube is constructed from silica glass.

17. The device of claim 15 wherein the heater includes a theromostatized fluid that is located in an interspace defined by an inner and outer wall of the reaction tube.

18. A device for curing a semiconductor wafer comprising:

a reaction tube for receiving a semiconductor wafer, the reaction tube including at least one gas admission port and at least one gas discharge port;

a heater for heating a reaction tube to base temperature, said heater is a resistance heater integrated into an outside wall of the reaction tube; and a selective heater for heating the semiconductor wafer to a curing temperature.

19. A device for curing a semiconductor wafer comprising:

a reaction tube for receiving a semiconductor wafer, the reaction tube including at least one gas admission port and at least one gas discharge port;

a heater for heating a reaction tube to a base temperature, said heater including a black body for absorbing light and converting it into heat, the black body being integrated into the reaction tube, and lamps for irradiating the black body; and a selective heater for heating the semiconductor wafer to a curing temperature.

20. A device for curing a semiconductor wafer comprising:

a reaction tube for receiving a semiconductor wafer, the reaction tube including at least one gas admission port and at least one gas discharge port;

a heater for heating a reaction tube to a base temperature, said heater is a resistance heater being integrated into an inside wall of said reaction tube; and a selective heater for heating the semiconductor wafer to a curing temperature.

* * * * *